United States Patent
Lin et al.

(10) Patent No.: US 8,426,277 B2
(45) Date of Patent: Apr. 23, 2013

(54) SEMICONDUCTOR PROCESS

(75) Inventors: Chien-Liang Lin, Taoyuan County (TW); Shih-Hung Tsai, Tainan (TW); Chun-Hsien Lin, Tainan (TW); Te-Lin Sun, Kaohsiung (TW); Shao-Wei Wang, Taichung (TW); Ying-Wei Yen, Miaoli County (TW); Yu-Ren Wang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 102 days.

(21) Appl. No.: 13/241,232

(22) Filed: Sep. 23, 2011

(65) Prior Publication Data

US 2013/0078818 A1 Mar. 28, 2013

(51) Int. Cl.
*H01L 21/336* (2006.01)
*H01L 21/8238* (2006.01)

(52) U.S. Cl.
USPC ............ 438/283; 438/206; 438/268; 438/197

(58) Field of Classification Search .................. 438/197, 438/206, 268, 283
See application file for complete search history.

(56) References Cited

U.S. PATENT DOCUMENTS

| | | |
|---|---|---|
| 5,498,768 A | 3/1996 | Nishitani |
| 6,043,138 A | 3/2000 | Ibok |
| 6,063,698 A | 5/2000 | Tseng |
| 6,251,761 B1 | 6/2001 | Rodder |
| 6,339,017 B1 * | 1/2002 | Yu ................................ 438/585 |
| 6,380,104 B1 | 4/2002 | Yu |
| 6,492,216 B1 | 12/2002 | Yeo |
| 6,492,217 B1 | 12/2002 | Bai |
| 6,642,066 B1 | 11/2003 | Halliyal |
| 6,656,852 B2 | 12/2003 | Rotondaro |
| 6,696,345 B2 | 2/2004 | Chau |
| 6,818,517 B1 | 11/2004 | Maes |
| 6,818,553 B1 | 11/2004 | Yu |
| 6,841,484 B2 | 1/2005 | Ying |
| 6,921,711 B2 | 7/2005 | Cabral, Jr. |
| 6,921,963 B2 | 7/2005 | Krivokapic |
| 7,012,027 B2 | 3/2006 | Perng |
| 7,030,430 B2 | 4/2006 | Doczy |
| 7,087,477 B2 | 8/2006 | Fried |
| 7,091,551 B1 | 8/2006 | Anderson |
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |
| 7,208,366 B2 | 4/2007 | Tsai |
| 7,247,887 B2 | 7/2007 | King |
| 7,250,658 B2 | 7/2007 | Doris |
| 7,297,600 B2 * | 11/2007 | Oh et al. ........................ 438/283 |
| 7,309,626 B2 | 12/2007 | Ieong |
| 7,352,034 B2 | 4/2008 | Booth, Jr. |
| 7,371,649 B2 | 5/2008 | Cheng |
| 7,381,608 B2 | 6/2008 | Brask |
| 7,384,880 B2 | 6/2008 | Brask |
| 7,420,230 B2 * | 9/2008 | Tsuchiaki ...................... 257/220 |

(Continued)

*Primary Examiner* — Luan C Thai
(74) *Attorney, Agent, or Firm* — Winston Hsu; Scott Margo

(57) ABSTRACT

A semiconductor process includes the following steps. A substrate is provided. At least a fin-shaped structure is formed on the substrate and an oxide layer is formed on the substrate without the fin-shaped structure forming thereon. A thermal treatment process is performed to form a melting layer on at least a part of the sidewall of the fin-shaped structure.

22 Claims, 6 Drawing Sheets

U.S. PATENT DOCUMENTS

| | | |
|---|---|---|
| 7,470,570 B2 | 12/2008 | Beintner |
| 7,488,656 B2 | 2/2009 | Cartier |
| 7,501,336 B2 | 3/2009 | Doyle |
| 7,521,324 B2 | 4/2009 | Ohmi |
| 7,531,437 B2 | 5/2009 | Brask |
| 7,569,857 B2 | 8/2009 | Shaheen et al. |
| 7,601,648 B2 | 10/2009 | Chua |
| 7,824,990 B2 | 11/2010 | Chang |
| 2004/0007561 A1 | 1/2004 | Nallan |
| 2004/0195624 A1 | 10/2004 | Liu |
| 2005/0051825 A1 | 3/2005 | Fujiwara |
| 2005/0202624 A1 | 9/2005 | Li |
| 2005/0272190 A1* | 12/2005 | Lee et al. ............... 438/176 |
| 2005/0275035 A1 | 12/2005 | Mathew |
| 2006/0054943 A1 | 3/2006 | Li |
| 2006/0094192 A1 | 5/2006 | Yang |
| 2006/0099830 A1 | 5/2006 | Walther |
| 2006/0172548 A1 | 8/2006 | Wu |
| 2006/0211259 A1 | 9/2006 | Maes |
| 2006/0284271 A1 | 12/2006 | Doyle |
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0070395 A1 | 3/2008 | Yen |
| 2008/0157208 A1 | 7/2008 | Fischer |
| 2008/0157231 A1 | 7/2008 | Wang |
| 2008/0173942 A1* | 7/2008 | Zhu et al. ............... 257/347 |
| 2009/0057787 A1 | 3/2009 | Matsuki |
| 2009/0124097 A1 | 5/2009 | Cheng |
| 2009/0179283 A1 | 7/2009 | Adams |
| 2009/0242964 A1 | 10/2009 | Akil |
| 2009/0269916 A1 | 10/2009 | Kang |
| 2010/0048027 A1 | 2/2010 | Cheng |
| 2010/0062592 A1 | 3/2010 | Clark |
| 2010/0068877 A1 | 3/2010 | Yeh |
| 2010/0072553 A1 | 3/2010 | Xu |
| 2010/0075507 A1 | 3/2010 | Chang |
| 2010/0081262 A1 | 4/2010 | Lim |
| 2010/0144121 A1 | 6/2010 | Chang |
| 2010/0167506 A1 | 7/2010 | Lin |
| 2010/0184281 A1 | 7/2010 | Hsu |
| 2010/0219481 A1 | 9/2010 | Tseng |

* cited by examiner

SEMICONDUCTOR PROCESS

BACKGROUND OF THE INVENTION

1. Field of the Invention

The present invention relates generally to a semiconductor process, and more specifically, to a semiconductor process, which applies a thermal treatment process to make the sidewalls of fin-shaped structures smoother.

2. Description of the Prior Art

With increasing miniaturization of semiconductor devices, various Fin-shaped field effect transistor (FinFET) devices have been developed. The Fin-shaped field effect transistor (FinFET) is advantageous for the following reasons. First, manufacturing processes of Fin-shaped field effect transistor (FinFET) devices can be integrated into traditional logic device processes, and thus are more compatible. In addition, since the three-dimensional structure of the FinFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

The methods of forming the fin-shaped structures of the FinFET include: a lithography process is performed to pattern a mask layer on a substrate. The patterns of the patterned mask layer are transferred to the substrate by using the patterned mask layer as a hard mask, so that at least a fin-shaped structure is formed on the substrate. However, the surfaces of the sidewalls of the fin-shaped structure formed by the lithography process are unsmooth and have defects formed as etching causes a bad quality of the channel region and causes layers to not cover the fin-shaped structure closely, therefore reducing the electrical performance of the semiconductor structure formed on the fin-shaped structure.

SUMMARY OF THE INVENTION

The present invention provides a semiconductor process, which performs a thermal treatment process, more especially for a thermal treatment process with a temperature higher than 1200° C., to form a melting layer on the sidewalls of the fin-shaped structure, so that the sidewalls of the fin-shaped structure can be smoother.

The present invention provides a semiconductor process including the following steps. A substrate is provided. At least a fin-shaped structure is formed on the substrate and an oxide layer is formed on the substrate without the fin-shaped structure formed thereon. A thermal treatment process is performed to form a melting layer on at least apart of the sidewalls of the fin-shaped structure.

The present invention provides a semiconductor process including the following steps. A bulk substrate is provided. A mask layer is formed on the bulk substrate. The mask layer is patterned and at least a fin-shaped structure is formed by using the mask layer as a hard mask. An oxide layer is formed on the bulk substrate without the fin-shaped structure formed thereon. A thermal treatment process with a temperature of higher than 1200° C. is performed to form a melting layer on a part of the sidewalls of the fin-shaped structure.

The present invention provides a semiconductor process including the following steps. A silicon-on-insulator substrate including a silicon substrate, a bottom oxide layer located on the silicon substrate and a silicon layer located on the bottom oxide layer is provided. A mask layer is formed on the silicon layer. A lithography process is performed to pattern the mask layer, making the silicon layer form at least a fin-shaped structure and therefore expose a part of the bottom oxide layer on the silicon-on-insulator substrate without the fin-shaped structure formed thereon by using the mask layer as a hard mask. A thermal treatment process with a temperature higher than 1200° C. is performed to form a melting layer on at least a part of the sidewalls of the fin-shaped structure.

The present invention provides a semiconductor process, which forms a melting layer on the sidewalls of the fin-shaped structure by a thermal treatment process (especially to a thermal treatment process with a temperature higher than 1200° C.). In doing this, the defects in the surface of the sidewalls of the fin-shaped structure can repair and re-crystallize in the present invention, so that the problem of the unsmooth surface of sidewalls of the fin-shaped structure after the fin-shaped structure is patterned can be solved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
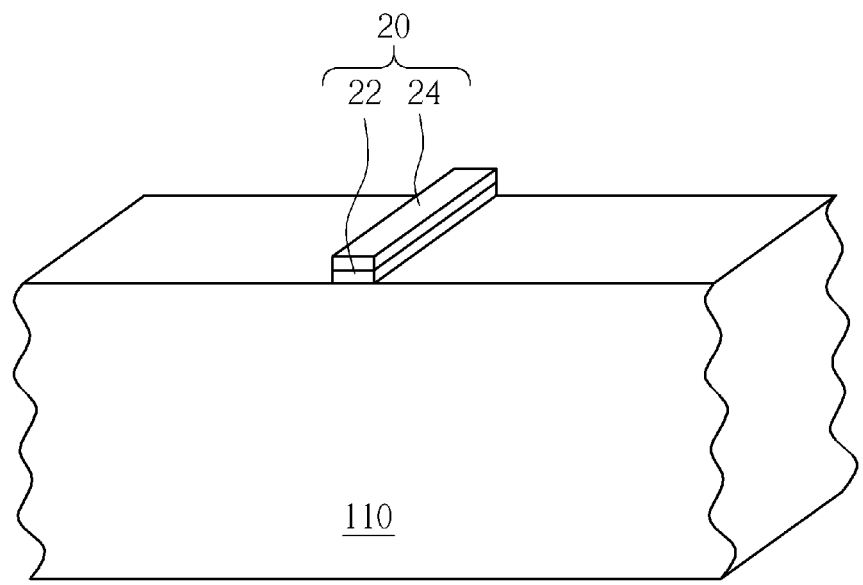
FIGS. 1-5, 8-9 schematically depict a cross-sectional view of a semiconductor process according to one preferred embodiment of the present invention.

FIGS. 1-10 schematically depict a cross-sectional view of a semiconductor process according to one preferred embodiment of the present invention. As shown in FIG. 1, a substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A mask layer 20 is formed on the substrate 110, wherein the mask layer 20 may include a pad oxide layer 22 and a nitride layer 24 located on the pad oxide layer 22. A lithography process is performed to pattern the mask layer 20 and expose a part of the substrate 110.

Figure 2:
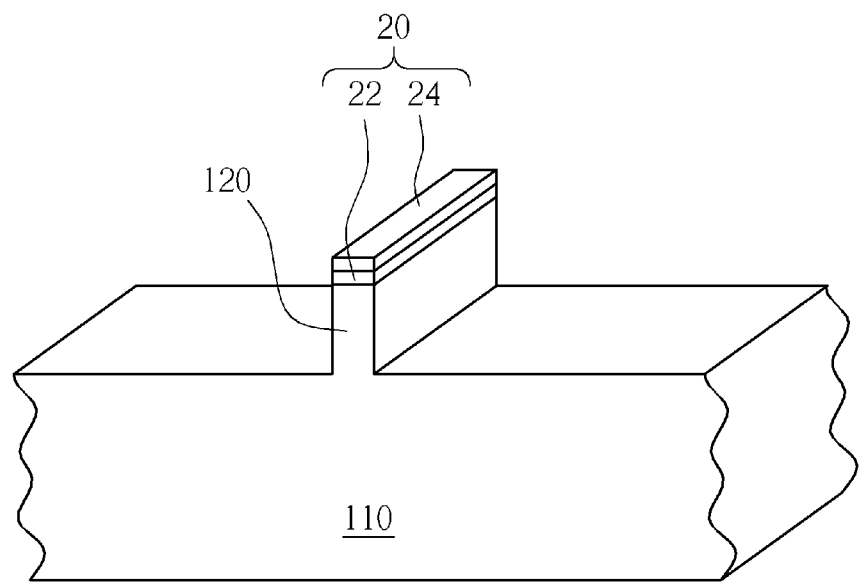

As shown in FIG. 2, the substrate 110 is etched and then a fin-shaped structure 120 is formed by using the mask layer 20 as a hard mask. In another embodiment, the mask layer 20 is patterned to expose the region of the substrate 110 needed to form a fin-shaped structure. An epitaxial process is performed to form a fin-shaped structure (not shown) on the region of the substrate 110 protruding from the mask layer 20. Otherwise, the present invention just depicts one fin-shaped structure 120 on the substrate 110, but the numbers of the fin-shaped structure 120 may be more than one.

Figure 3:
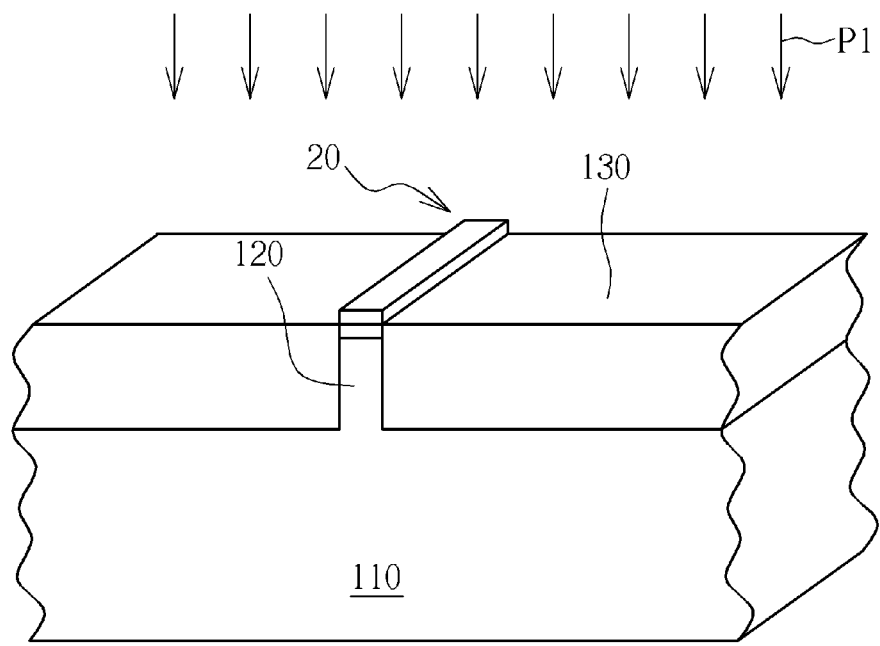

As shown in FIG. 3, an oxide layer 130 is formed on the substrate 110 without the fin-shaped structure 120 formed thereon by the methods such as a shallow trench isolation technology. The shallow trench isolation technology may include the following items. A liner (not shown) may be selectively filled on the sidewalls of the fin-shaped structure 120 for buffering, wherein the liner may be an oxide layer. A shallow trench isolation material is filled on the substrate 110 without the fin-shaped structure 120 formed thereon, wherein the filling material may include a oxide to form an oxide layer (not shown) on the substrate 110 without the fin-shaped structure 120 formed thereon. An annealing process P1 is performed to densify the oxide layer (not shown), wherein the thermal annealing process P1 may import nitrogen gas during the process and the processing temperature of the thermal annealing process P1 is about 1050° C. A part of the oxide layer (not shown) is removed to form the oxide layer 130 by processes such as an etching back process or a chemical mechanical polishing process (not shown).

Figure 4:
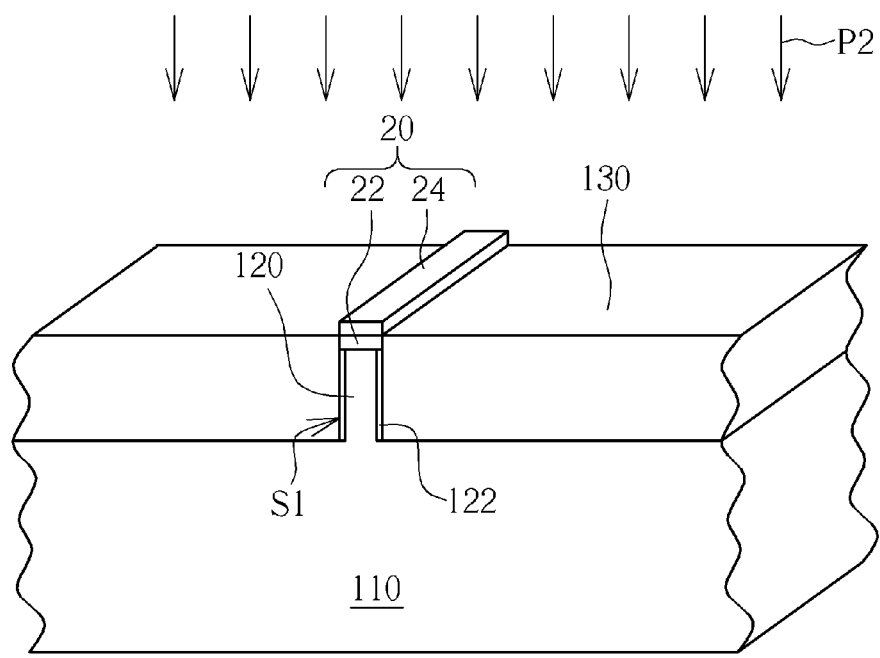

As shown in FIG. 4, a thermal treatment process P2 is performed to form a melting layer 122 on the surface S1 of the sidewalls of the fin-shaped structure 120. In doing this, the defects in the surface S1 of the sidewalls of the fin-shaped structure 120 caused by etching can repair and re-crystallize, to solve the problem of the unsmooth surface S1 of the sidewalls of the fin-shaped structure 120 after the fin-shaped structure 120 is patterned caused by processes such as etching. In other words, the thermal treatment process P2 applied in the present invention can make the surface S1 of the sidewalls of the fin-shaped structure 120 smoother. Thus, the semiconductor structure formed on the fin-shaped structure 120 by sequential processes (such as a dielectric layer covering the fin-shaped structure 120) can be formed uniformly on the fin-shaped structure 120, thereby the electrical performance of the forming semiconductor structure is enhanced. In one embodiment, the thermal treatment process P2 includes, but is not limited to, a laser thermal treatment process. The thermal treatment process P2, which can form a melting layer 122 on the surface S1 of the sidewalls of the fin-shaped structure 120 can be applied in the present invention. In a preferred embodiment, the processing temperature of the thermal treatment process P2 is higher than 1200° C. In a still preferred embodiment, as the substrate 110 is a silicon substrate, the processing temperature of the thermal treatment process P2 is higher than 1300° C., so that the surface S1 of the sidewalls of the fin-shaped structure 120 can be melted completely to form the melting layer 122.

Figure 5:
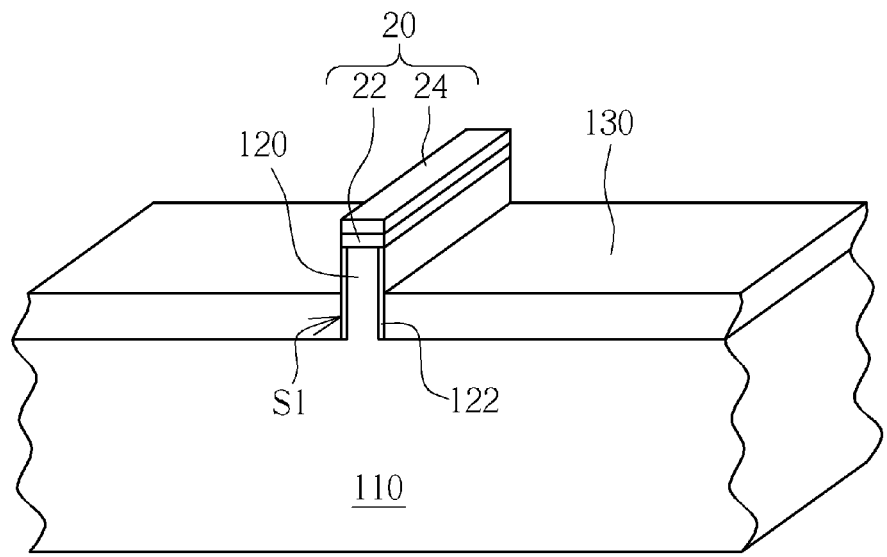

As shown in FIG. 5, after the thermal treatment process P2 is performed, a part of the oxide layer 130 is removed to form the needed isolation structure such as the shallow trench isolation structure surrounding the fin-shaped structure 120, and therefore expose a part of the sidewalls of the fin-shaped structure 120, wherein the methods of forming the oxide layer 130 may include performing an etching back process, but it is not limited thereto.

Figure 6:
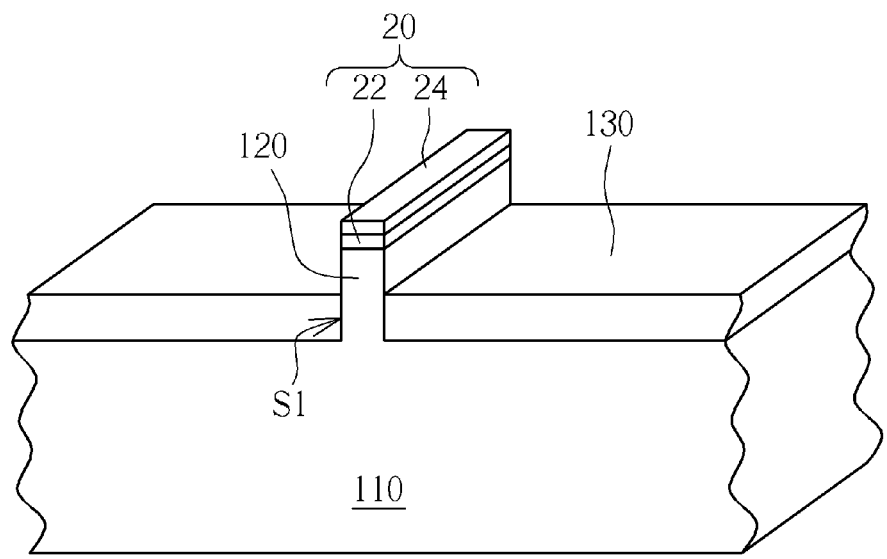
FIGS. 6-7 schematically depict a cross-sectional view of a semiconductor process according to one preferred embodiment of the present invention.
Figure 7:
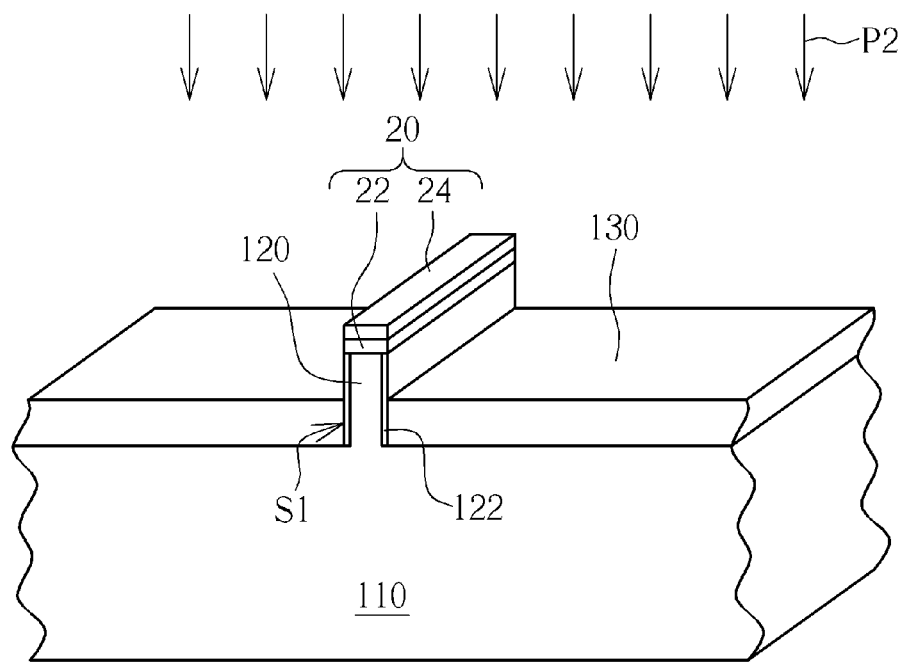

In another embodiment, as shown in FIG. 6, after the step of FIG. 3 is performed (the oxide layer 130 is formed on the substrate 110 without the fin-shaped structure 120 formed thereon), a part of the oxide layer 130 is removed by processes such as an etching back process to form the needed isolation structure such as the shallow trench isolation structure surrounding the fin-shaped structure 120, and therefore expose a part of the sidewalls of the fin-shaped structure 120. As shown in FIG. 7, the thermal treatment process P2 is performed to form the melting layer 122 on the surface S1 of the sidewalls of the fin-shaped structure 120. In doing this, the problem of the unsmooth surface S1 of the sidewalls of the fin-shaped structure 120 cause by processes such as an etching process can be solved. The performing timing of the thermal treatment process P2 of the former (as shown in FIG. 4) is better than the performing timing of the thermal treatment process P2 of the letter (as shown in FIG. 7). Due to the thermal treatment process P2 of the former being performed as the sidewalls of fin-shaped structure 120 are not exposed (especially to the atmosphere), the sidewalls of the fin-shaped structure 120 will not react with ingredients such as oxygen gas in processing environment or in the atmosphere, which pollutes the sidewalls of the fin-shaped structure 120. Otherwise, this embodiment can be performed according to the processing needs.

Figure 8:
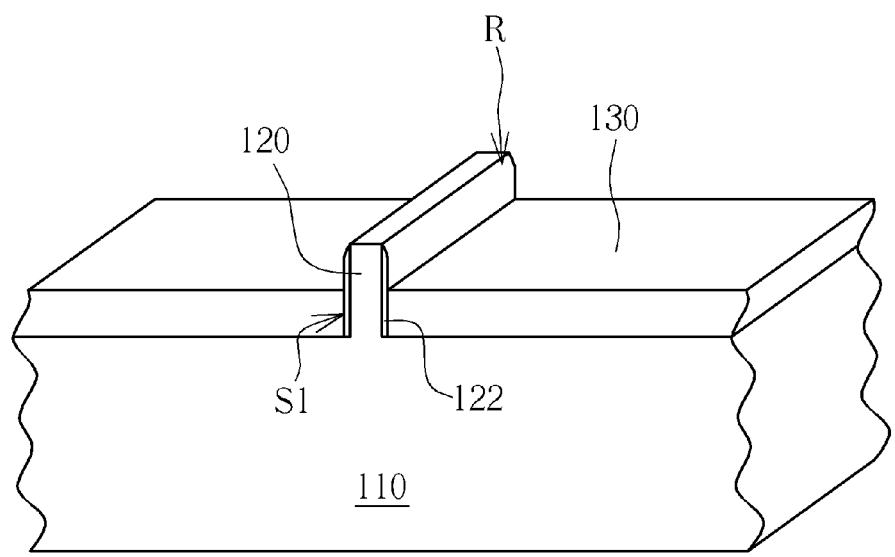

As shown in FIG. 8, after the step of FIG. 5 or FIG. 7 is performed (after the melting layer 122 is formed by the thermal treatment process P2 and the oxide layer 130 is etched back), an ion implantation process, such as an anti-punch through process, is selectively performed between the fin-shaped structure 120 and the substrate 110. The nitride layer 24 and the pad oxide layer 22 may be sequentially removed. A hydrogen containing annealing process may be selectively performed to round the top corner R of the fin-shaped structure 120.

In this embodiment, the nitride layer 24 and the pad oxide layer 22 are sequentially removed, and a tri-gate MOSFET can be formed in the following processes. There are three contact faces between the fin structure 120 and the following formed dielectric layer functioning as a carrier channel whose width is wider than a channel width in conventional planar MOSFET. When a driving voltage is applied, the tri-gate MOSFET produces a double on-current comparing to the conventional planar MOSFET.

In another embodiment, the nitride layer 24 and the pad oxide layer 22 are reserved to form a fin field effect transistor (FinFET), which is another kind of multi-gate MOSFET. Due to the nitride layer 24 and the pad oxide layer being reserved in the fin field effect transistor, there are only two contact faces between the fin structure 120 and the following formed dielectric layer.

Figure 9:
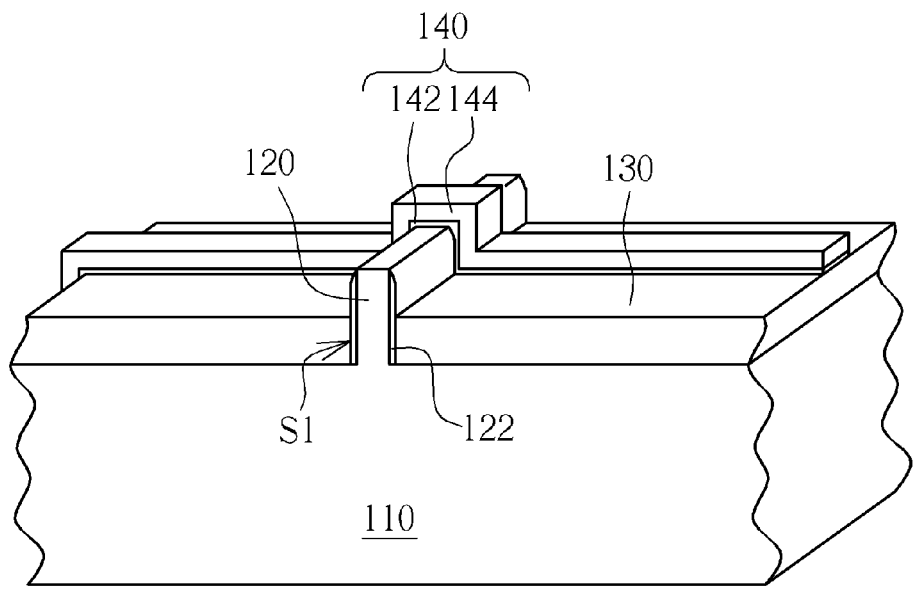

As shown in FIG. 9, a dielectric layer (not shown) and an electrode layer (not shown) are sequentially formed on the substrate 110. The electrode layer (not shown) and the dielectric layer (not shown) are patterned to form a gate structure 140, wherein the gate structure 140 includes a dielectric layer 142 and an electrode layer 144 located on the dielectric layer 140. The dielectric layer 140 may be an oxide layer or a dielectric layer having a high dielectric constant. If the dielectric layer 140 is a dielectric layer having a high dielectric constant, a buffer layer may be formed between the fin-shaped structure 120 and the dielectric layer having a high dielectric constant. The dielectric layer having a high dielectric constant may be selected from the group comprising hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST). The electrode layer 144 may be a polysilicon electrode layer. Other semiconductor processes may be performed in the following. For example, a lightly doped source/drain region (not shown) is selectively formed in the fin-shaped structure 120 beside the gate structure 140; a spacer (not shown) is formed on the sidewalls of the gate structure 140; a heavily doped source/drain region (not shown) is formed in the fin-shaped structure 120 beside the gate structure 140. Otherwise, processes such as a polysilicon gate process, a gate-first process or a gate-last process etc can be applied in the present invention. If the gate-last process is applied in the present invention, the polysilicon electrode layer will be replaced by at least a metal electrode layer. The steps of processes are known in the art, and are not described herein.

Figure 10:
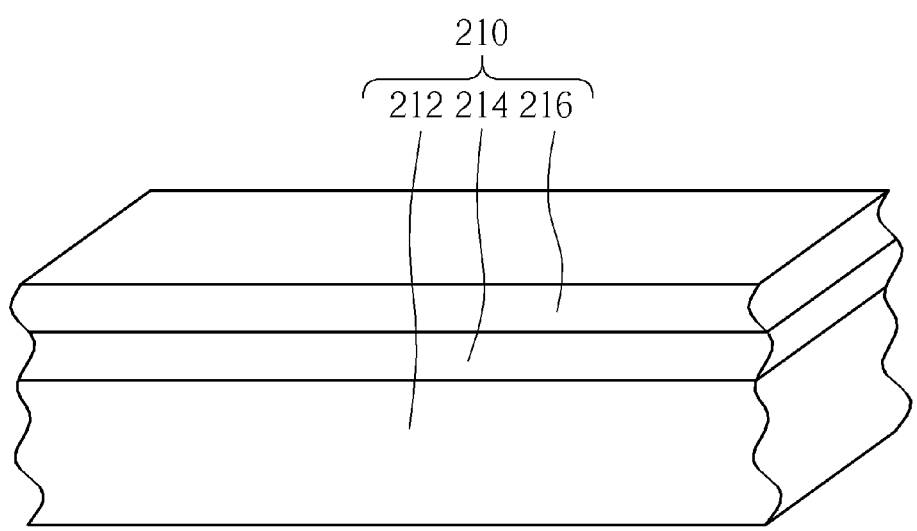
FIGS. 10-11 schematically depict a cross-sectional view of a semiconductor process according to one preferred embodiment of the present invention.
Figure 11:
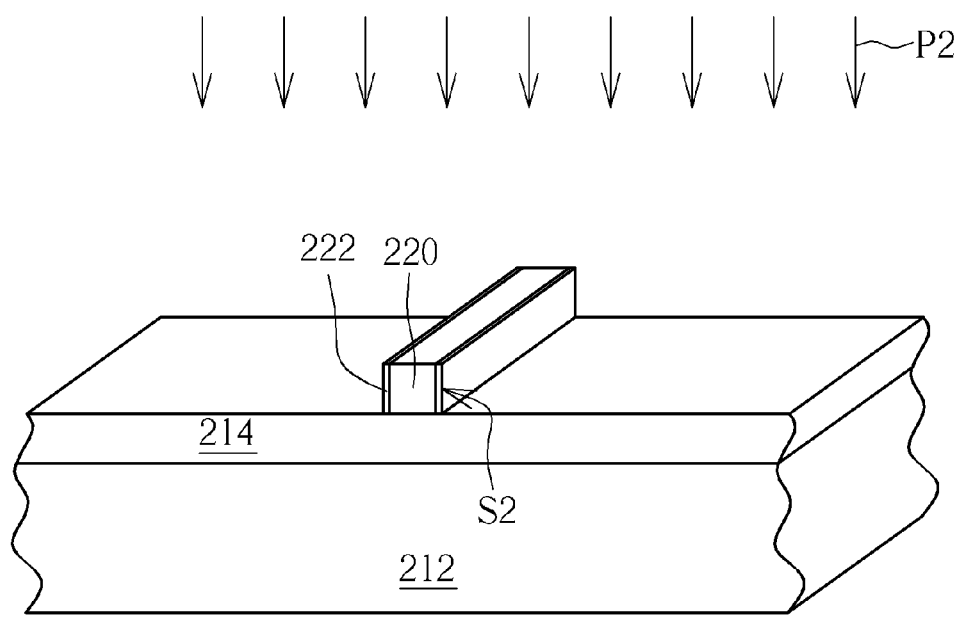

Otherwise, the substrate 110 of the aforesaid embodiment is a bulk substrate. The present invention, however, can also be applied to a silicon-on-insulator substrate. As shown in FIGS. 10-11, a silicon-on-insulator substrate 210 is provided, which includes a silicon substrate 212, a bottom oxide layer 214 located on the silicon substrate 212 and a silicon layer 216 located on the bottom oxide layer 214. As shown in FIG. 11, the silicon layer 216 is patterned to form the fin-shaped structure 220 and expose a part of the bottom oxide layer 214 on the silicon substrate 212 without the fin-shaped structure 220 formed thereon. In doing this, the fin-shaped structure 220 is formed on the silicon substrate 212 and an oxide layer (such as a bottom oxide layer 214) is formed on the silicon substrate 212 without the fin-shaped structure 220 formed thereon. The oxide layer 130 formed on the silicon substrate 110 (as shown in FIG. 3) is located on the substrate 110 without the fin-shaped structure 120 formed thereon, but the fin-shaped structure 220 is located on the bottom oxide layer 214 of the silicon-on-insulator substrate 210. Due to the bottom oxide layer 214 being formed while the fin-shaped structure 120 is formed on the substrate 110, the thermal treatment process P2 of the present invention is performed after the bottom oxide layer 214 is formed to form a melting layer 222 on the sidewalls of the fin-shaped structure 220. In doing this, the defects of the surface S2 of the sidewalls of the fin-shaped structure 220 can repair and re-crystallize, therefore the problem of the unsmooth surface S2 of the sidewalls of the fin-shaped structure 220 after the fin-shaped structure 220 is patterned caused by etching can be solved. In other words, the present invention applying the thermal treatment process P2 can make the surface S2 of the sidewalls of the fin-shaped structure 220 smoother. Therefore, the semiconductor structure formed on sequential processes (such as a dielectric layer covering the fin-shaped structure 220) can be formed on the fin-shaped structure 220 uniformly, and the electrical performance of the semiconductor structure can therefore be enhanced. In one embodiment, the thermal treatment process P2 includes a laser thermal treatment process, but it is not limited thereto. In a preferred embodiment, the processing temperature of the thermal treatment process P2 is higher than 1200° C. In a still preferred embodiment, the processing temperature of the thermal treatment process P2 is higher than 1300° C., so the surface S2 of the sidewalls of the fin-shaped structure 220 can be melted completely to form the melting layer 222.

To summarize, the present invention provides a semiconductor process, which forms a melting layer on the sidewalls of the fin-shaped structure by performing a thermal treatment process. Thus, the defects of the surface of the sidewalls of the fin-shaped structure can repair and re-crystallize, and the problem of the unsmooth surface of sidewalls of the fin-shaped structure after the fin-shaped structure is patterned caused by etching process or etc can be solved. In detail, the thermal treatment process may be a laser thermal treatment process. In a preferred embodiment, the processing temperature of the thermal treatment process is higher than 1200° C., preferably higher than 1300° C., for making the surface of the sidewalls of the fin-shaped structure melted completely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a substrate;
   forming at least a fin-shaped structure on the substrate and an oxide layer on the substrate without the fin-shaped structure formed thereon; and
   performing a thermal treatment process to form a melting layer on at least a part of the sidewalls of the fin-shaped structure.

2. The semiconductor process according to claim 1, wherein the substrate comprises a bulk substrate or a silicon-on-insulator substrate.

3. The semiconductor process according to claim 2, wherein the step of forming the fin-shaped structure on the bulk substrate comprises:
   forming a mask layer on the bulk substrate; and
   performing a lithography process to pattern the mask layer and forming at least a fin-shaped structure by using the mask layer as a hard mask.

4. The semiconductor process according to claim 2, wherein the silicon-on-insulator substrate comprises:
   a silicon substrate;
   a bottom oxide layer located on the silicon substrate; and
   a silicon layer located on the bottom oxide layer.

5. The semiconductor process according to claim 4, wherein the step of forming the fin-shaped structure comprises:
   patterning the silicon layer to form the fin-shaped structure and expose a part of the bottom oxide layer on the substrate without the fin-shaped structure formed thereon.

6. The semiconductor process according to claim 1, wherein the processing temperature of the thermal treatment process is higher than 1200° C.

7. The semiconductor process according to claim 6, wherein the processing temperature of the thermal treatment process is higher than 1300° C.

8. The semiconductor process according to claim 1, wherein the thermal treatment process comprises a laser thermal treatment process.

9. The semiconductor process according to claim 1, further comprising:
   after the thermal treatment process is performed,
   removing a part of the oxide layer.

10. The semiconductor process according to claim 1, further comprising:
    before the thermal treatment process is performed,
    removing a part of the oxide layer and therefore exposing a part of the sidewalls of the fin-shaped structure.

11. The semiconductor process according to claim 1, further comprising:
    after the oxide layer is formed,
    performing a thermal annealing process to densify the oxide layer.

12. The semiconductor process according to claim 11, wherein the processing temperature of the thermal annealing process is about 1050° C.

13. A semiconductor process, comprising:
    providing a bulk substrate;
    forming a mask layer on the bulk substrate;
    patterning the mask layer and forming at least a fin-shaped structure by using the mask layer as a hard mask;
    forming an oxide layer on the bulk substrate without the fin-shaped structure formed thereon; and
    performing a thermal treatment process with a temperature of higher than 1200° C. to form a melting layer on a part of the sidewalls of the fin-shaped structure.

14. The semiconductor process according to claim 13, wherein the bulk substrate comprises a bulk silicon substrate or a bulk silicon containing substrate.

15. The semiconductor process according to claim 13, wherein the processing temperature of the thermal treatment process is higher than 1300° C.

16. The semiconductor process according to claim 13, wherein the thermal treatment process comprises a laser thermal treatment process.

17. The semiconductor process according to claim 13, further comprising:

after the thermal treatment process is performed, removing a part of the oxide layer and therefore exposing a part of the sidewalls of the fin-shaped structure.

18. The semiconductor process according to claim 13, further comprising:

before the thermal treatment process is performed, removing a part of the oxide layer and therefore exposing a part of the sidewalls of the fin-shaped structure.

19. The semiconductor process according to claim 13, further comprising:

after the oxide layer is formed, performing a thermal annealing process to densify the oxide layer.

20. A semiconductor process, comprising:

providing a silicon-on-insulator substrate, comprising a silicon substrate, a bottom oxide layer located on the silicon substrate and a silicon layer located on the bottom oxide layer;

forming a mask layer on the silicon layer;

performing a lithography process to pattern the mask layer, making the silicon layer form at least a fin-shaped structure and therefore expose a part of the bottom oxide layer on the silicon-on-insulator substrate without the fin-shaped structure formed thereon by using the mask layer as a hard mask; and performing a thermal treatment process with a temperature of higher than 1200° C. to form a melting layer on at least a part of the sidewalls of the fin-shaped structure.

21. The semiconductor process according to claim 20, wherein the processing temperature of the thermal treatment process is higher than 1300° C.

22. The semiconductor process according to claim 20, wherein the thermal treatment process comprises a laser thermal treatment process.

* * * * *